United States Patent
Hwang et al.

(10) Patent No.: US 8,835,985 B2
(45) Date of Patent: Sep. 16, 2014

(54) POWER ELECTRONIC DEVICE AND METHOD OF MANUFACTURING THE SAME

(75) Inventors: In-jun Hwang, Hwaseong-si (KR);
Jai-kwang Shin, Anyang-si (KR);
Jae-joon Oh, Seongnam-si (KR);
Jong-seob Kim, Hwaseong-si (KR);
Hyuk-soon Choi, Hwaseong-si (KR);
Ki-ha Hong, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 35 days.

(21) Appl. No.: 13/208,671

(22) Filed: Aug. 12, 2011

(65) Prior Publication Data
US 2012/0037958 A1   Feb. 16, 2012

(30) Foreign Application Priority Data
Aug. 13, 2010   (KR) .................. 10-2010-0078484

(51) Int. Cl.
*H01L 29/778*   (2006.01)
*H01L 29/40*    (2006.01)
*H01L 29/66*    (2006.01)
*H01L 29/20*    (2006.01)

(52) U.S. Cl.
CPC .......... *H01L 29/7787* (2013.01); *H01L 29/408* (2013.01); *H01L 29/66462* (2013.01); *H01L 29/2003* (2013.01)
USPC 257/194; 257/76; 257/E21.403; 257/E29.089; 438/172; 438/589

(58) Field of Classification Search
USPC ............ 257/194, E29.246, E21.403; 438/172
See application file for complete search history.

(56) References Cited

U.S. PATENT DOCUMENTS

| | | | | |
|---|---|---|---|---|
| 5,254,867 A * | 10/1993 | Fukuda et al. | ............... | 257/411 |
| 5,323,041 A * | 6/1994  | Matsushita et al. | ........... | 257/339 |
| 5,576,517 A   | 11/1996 | Wojnarowski et al. | | |
| 2004/0232408 A1 | 11/2004 | Heeger et al. | | |
| 2005/0110042 A1* | 5/2005 | Saito et al. | ..................... | 257/192 |
| 2005/0145883 A1* | 7/2005 | Beach et al. | ................... | 257/194 |
| 2005/0258431 A1* | 11/2005 | Smith et al. | ..................... | 257/79 |
| 2006/0043415 A1* | 3/2006 | Okamoto et al. | ............. | 257/192 |
| 2006/0065911 A1* | 3/2006 | Twynam | ....................... | 257/192 |
| 2008/0237639 A1* | 10/2008 | Nanjo et al. | ................... | 257/194 |
| 2009/0206373 A1* | 8/2009 | Yafune et al. | ................. | 257/256 |

(Continued)

FOREIGN PATENT DOCUMENTS

| | | | |
|---|---|---|---|
| JP | 2002324813 A | 11/2002 | |
| JP | 2007165638 A | 6/2007  | |

(Continued)

*Primary Examiner* — Minh-Loan T Tran
*Assistant Examiner* — Fazli Erdem
(74) *Attorney, Agent, or Firm* — Harness, Dickey & Pierce, P.L.C.

(57) ABSTRACT

According to an example embodiment, a power electronic device includes a first semiconductor layer, a second semiconductor layer on a first surface of the first semiconductor layer, and a source, a drain, and a gate on the second semiconductor layer. The source, drain and gate are separate from one another. The power electronic device further includes a 2-dimensional electron gas (2DEG) region at an interface between the first semiconductor layer and the second semiconductor layer, a first insulating layer on the gate and a second insulating layer adjacent to the first insulating layer. The first insulating layer has a first dielectric constant and the second insulating layer has a second dielectric constant less than the first dielectric constant.

22 Claims, 4 Drawing Sheets

(56) References Cited

U.S. PATENT DOCUMENTS

| | | | |
|---|---|---|---|
| 2009/0250723 A1* | 10/2009 | Twynam | 257/192 |
| 2009/0309134 A1* | 12/2009 | Nishio et al. | 257/192 |
| 2010/0012977 A1* | 1/2010 | Derluyn et al. | 257/194 |
| 2010/0117146 A1* | 5/2010 | Ikeda et al. | 257/330 |
| 2010/0171150 A1* | 7/2010 | Smith et al. | 257/194 |
| 2010/0176421 A1* | 7/2010 | Van Hove et al. | 257/194 |
| 2010/0259321 A1* | 10/2010 | Tserng et al. | 327/581 |
| 2011/0068371 A1* | 3/2011 | Oka | 257/194 |
| 2012/0161153 A1* | 6/2012 | Yumoto et al. | 257/76 |
| 2013/0032816 A1* | 2/2013 | Hwang et al. | 257/76 |
| 2013/0292698 A1* | 11/2013 | Then et al. | 257/76 |

FOREIGN PATENT DOCUMENTS

| | | |
|---|---|---|
| JP | 2009004504 A | 1/2009 |
| JP | 2009033041 A | 2/2009 |
| KR | 1020090104444 | 10/2009 |

* cited by examiner ical priority under 35 U.S.C. §119 to
POWER ELECTRONIC DEVICE AND METHOD OF MANUFACTURING THE SAME

CROSS-REFERENCE TO RELATED APPLICATIONS

This application claims priority under 35 U.S.C. §119 to Korean Patent Application No. 10-2010-0078484, filed on Aug. 13, 2010, in the Korean Intellectual Property Office (KIPO), the entire contents of which are incorporated herein by reference.

BACKGROUND

1. Field

Example embodiments relate to power electronic devices and methods of manufacturing the same.

2. Description of the Related Art

As communications technologies have been developed, research is directed to power electronic devices used in a high frequency band have been made. In particular, field effect type semiconductor devices, such as high electron mobility transistors (HEMTs), have been drawing attention as power electronic devices used in a high frequency region.

HEMTs may be used in high voltage-applied fields and have high breakdown voltages. The HEMTs are heterojunction field effect transistors each having a structure formed by combining materials having different band gaps. As the materials having different band gaps are formed in a heterojunction structure, a 2-dimensional electron gas (2DEG) layer is induced into a junction surface of the HEMTs so that the movement speed of electrons can be improved.

In general, silicon, which is widely used in semiconductor devices, has low electron mobility. Thus, a high source resistance may be generated in silicon, and research is directed to using a III-V group semiconductor compound in HEMTs. In particular, a nitride gallium-based compound has a relatively wide band gap, has high electron saturation velocity, and is chemically stable and thus has been drawing attention as a material for HEMTs. Thus, research is directed to manufacturing HEMTs using a nitride gallium-based compound as high-temperature, high-output, and high-frequency electronic devices.

SUMMARY

According to an example embodiment, a power electronic device includes a first semiconductor layer, a second semiconductor layer on a first surface of the first semiconductor layer, a source, a drain, and a gate on the second semiconductor layer, a 2-dimensional electron gas (2DEG) region at an interface between the first semiconductor layer and the second semiconductor layer, a first insulating layer on the gate, and a second insulating layer at least adjacent to the first insulating layer. The source, drain and gate are separate from one another. The first insulating layer has a first dielectric constant. The second insulating layer has a second dielectric constant less than the first dielectric constant.

According to an example embodiment, the second insulating layer is around the first insulating layer.

According to an example embodiment, the first insulating layer is on the gate, the source, and the drain. The second insulating layer is on the first insulating layer.

According to an example embodiment, the second insulating layer is on the drain.

According to an example embodiment, the power electronic device, further includes a third insulating layer having a third dielectric constant. The second insulating layer is between the first insulating layer and the third insulating layer.

According to an example embodiment, the third insulating layer is on the drain.

According to an example embodiment, the first dielectric constant is equal to the third dielectric constant.

According to an example embodiment, the third dielectric constant is higher than the second dielectric constant.

According to an example embodiment, the first semiconductor layer includes a III-V group semiconductor compound.

According to an example embodiment, the first semiconductor layer includes at least one of gallium nitride (GaN), gallium arsenic (GaAs), indium nitride (InN) and a combination thereof.

According to an example embodiment, the second semiconductor layer includes at least one of aluminum gallium nitride (AlGaN), aluminum gallium arsenic (AlGaAs), aluminum indium nitride (AlInN) and a combination thereof.

According to an example embodiment, the power electronic device, further includes a third insulating layer on a second surface of the first semiconductor layer. The third insulating layer has a third dielectric constant.

According to an example embodiment, the third dielectric constant is less than the first dielectric constant.

According to an example embodiment, the power electronic device, further includes a plurality of third insulating layers on a second surface of the first semiconductor layer. Each of the third insulating layers has a different dielectric constant.

According to an example embodiment, a method of manufacturing a power electronic device includes sequentially stacking a first semiconductor layer and a second semiconductor layer, forming a source, a drain, and a gate on the second semiconductor layer, depositing a first insulating material on the source, the drain, and the gate, etching a portion of the first insulating material to from a recess, and depositing a second insulating material in the recess. The first insulating material has a first dielectric constant different from a second dielectric constant of the second insulating material.

According to an example embodiment, the first dielectric constant of the first insulating material is higher than the second dielectric constant of the second insulating material.

BRIEF DESCRIPTION OF THE DRAWINGS

Example embodiments will be more clearly understood from the following brief description taken in conjunction with the accompanying drawings. FIGS. 1-5D represent non-limiting, example embodiments as described herein.

FIG. 2 is a graph schematically showing a voltage and an electric field applied to each material layer when an electric field is applied perpendicular to a junction surface of a power electronic device, formed by combining materials having different dielectric constants;

FIGS. 3 and 4 are cross-sectional views of power electronic devices according to another example embodiment; and FIGS. 5A through 5D are cross-sectional views of a method of manufacturing a power electronic device, according to an example embodiment.

Figure 1A:
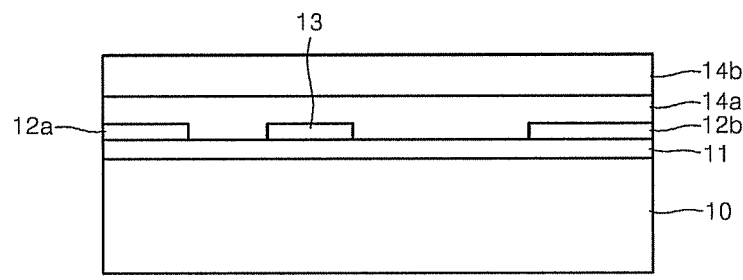
FIGS. 1A through 1C are cross-sectional views of structures of power electronic devices according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1B:
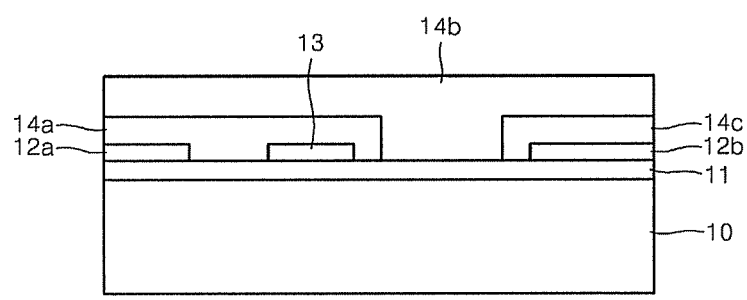
Figure 1C:
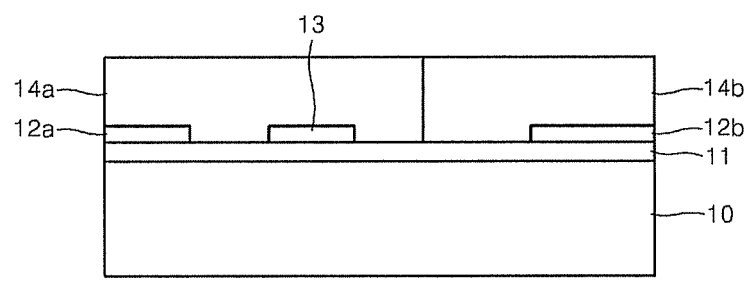

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved FIGS. 1A through 1C are cross-sectional views of structures of power electronic devices according to example embodiments. The power electronic devices may be high electron mobility transistors (HEMTs).

Referring to FIG. 1A, a first semiconductor layer 10 and a second semiconductor layer 11 may be sequentially formed, and a source 12a, a drain 12b, and a gate 13 are formed on the second semiconductor layer 11 separate from one another. A first insulating layer 14a and a second insulating layer 14b may be sequentially formed on the second semiconductor layer 11, the source 12a, the drain 12b, and the gate 13. The first insulating layer 14a and the second insulating layer 14b may be formed of materials having different dielectric constants. The first insulating layer 14a may be formed of a material having a high dielectric constant, and the second insulating layer 14b may be formed of a material having a dielectric constant lower than that of the first insulating layer 14a.

Referring to FIG. 1B, a first semiconductor layer 10 and a second semiconductor layer 11 are sequentially formed, and a source 12a, a drain 12b, and a gate 13 are formed on the second semiconductor layer 11 separate from one another. A first insulating layer 14a may be formed on the source 12a and the gate 13, and a third insulating layer 14c may be formed on the drain 12b, and a second insulating layer 14b may be formed on the second semiconductor layer 11 between the first insulating layer 14a and the third insulating layer 14c, and on the first insulating layer 14a and the third insulating layer 14c. The first insulating layer 14a and the third insulating layer 14c may be formed of a material having a high dielectric constant, and the second insulating layer 14b may be formed of a material having a dielectric constant lower than those of the first insulating layer 14a and the third insulating layer 14c. According to an example embodiment, the dielectric constant of the first insulating layer 14a and the third insulating layer 14c may be equal.

Referring to FIG. 1C, a first semiconductor layer 10 and a second semiconductor layer 11 are sequentially formed, and a source 12a, a drain 12b, and a gate 13 are formed on the second semiconductor layer 11 separate from one another. A first insulating layer 14a may be formed on the source 12a and the gate 13, and a second insulating layer 14b may be formed on the drain 12b. The first insulating layer 14a may be formed of a material having a high dielectric constant, and the second insulating layer 14b may be fanned of a material having a dielectric constant lower than that of the first insulating layer 14a. Alternatively, the dielectric constant of 14b may be greater than the dielectric constant of 14a.

The first semiconductor layer 10 may have a structure in which a semiconductor material is formed on a substrate. In this regard, the substrate may be a silicon (Si) substrate, a gallium nitride (GaN) substrate, a silicon carbide (SiC) substrate, a sapphire substrate, or the like. The first semiconductor layer 10 may include a III-V group semiconductor compound, for example, a GaN layer, a gallium arsenic (GaAs) layer, indium nitride (InN), or a combination thereof. The second semiconductor layer 11 may be formed of aluminum gallium nitride (AlGaN), aluminum gallium arsenic (AlGaAs), aluminum indium nitride (AlInN), or a combination thereof. The first semiconductor layer 10 and the second semiconductor layer 11 may be compound semiconductor layers having different lattice constants. A 2-dimensional electron gas (2DEG) region may be formed at an interface between the first semiconductor layer 10 and the second semiconductor layer 11 due to a heterojunction structure of the first semiconductor layer 10 and the second semiconductor layer 11. The 2DEG region may be used as a channel of a power electronic device.

The source 12a, the drain 12b, and the gate 13 may be formed of a conductive material, for example, a metal, a conductive metal oxide, a conductive metal nitride, or the like. The source 12a, the drain 12b, and the gate 13 may be formed as a single layer structure or a multi-layer structure. The gate 13 may have a step height.

In the power electronic device according to the example embodiments, the first insulating layer 14a is partially formed around the gate 13 to surround the gate 13 by using a high-k material, and the second insulating layer 14b is formed around the first insulating layer 14a by using a material with a lower dielectric constant than that of the first insulating layer 14a, thereby preventing a high electric field from being applied to the gate 13. This will be described below in detail.

In order for the power electronic device, for example, a HEMT, to operate at high output, a high voltage is applied between the source 12a and the drain 12b. A strong electric field is formed in a region of the gate 13 adjacent to the drain 12b. When the electric field applied to the gate 13 exceeds a predetermined or a desired level, a device destruction phenomenon may occur. Thus, a structure for reducing the electric field applied to the gate 13 is desired. In the power electronic device according to the example embodiment, the first insulating layer 14a is formed in the region of the gate 13 by using a material having a higher dielectric constant than that of a layer adjacent to the gate 13. Thus, a breakdown voltage of the power electronic device may be reduced.

In the power electronic device according to the example embodiment, the first insulating layer 14a may be formed of a material having a high dielectric constant in a peripheral region that contacts the gate 13. Alternatively, the first insulating layer 14a may also be formed of a material with a high dielectric constant in a peripheral region that contacts the drain 12b. Thus, as illustrated in FIG. 1A, the first insulating layer 14a may be formed in a region that contacts the gate 13 and the drain 12b, and the second insulating layer 14b may be formed on the first insulating layer 14a. As illustrated in FIG. 1B, the first insulating layer 14a and the third insulating layer 14c may be formed on the gate 13 and the drain 12b, respectively, by using a material with a partially high dielectric constant. As illustrated in FIG. 1C, the first insulating layer 14a may be formed only around the gate 13.

Figure 2:
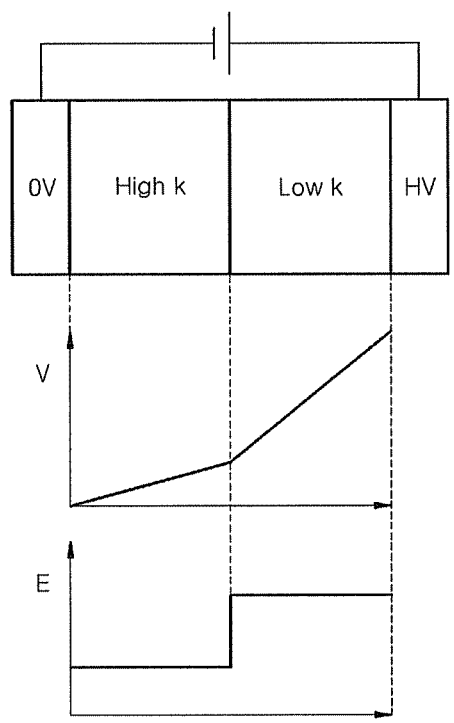

FIG. 2 is a graph schematically showing a voltage and an electric field applied to each material layer when an electric field is applied perpendicular to a junction surface of a power electronic device, formed by combining materials having different dielectric constants.

Referring to FIG. 2, a material layer High k having a high dielectric constant and a material layer Low k having a relatively low dielectric constant, for example, materials having different dielectric constants, are combined to each other, and 0 V and a high voltage HV are respectively applied to sides of the material layer High k and the material layer Low k through electrodes. In this case, a high voltage and a high electric field are applied to the material layer Low k having a lower dielectric constant than that of the material layer High k having a high dielectric constant. A material layer having a high dielectric constant may be formed in a region of the gate 13 having high electric field concentration by using the principle described above, and a material layer having a relatively low dielectric constant may be formed in a region having low electric field concentration. Thus, a breakdown voltage of a device may be increased by alleviating the electric field concentration and adjusting the electric field distribution. Materials used in the first, second, and third insulating layers 14a, 14b, and 14c may be various dielectric materials, such as silicon (Si) oxide, Si nitride, hafnium (Hf) oxide, aluminum (Al) oxide, calcium (Ca) oxide, copper (Cu) oxide, zirconium (Zr) oxide, zinc (Zn) oxide, titanium (Ti) oxide, tantalum (Ta) oxide, barium (Ba) oxide, zinc silicon (ZnSi) oxide, zirconium silicon (ZrSi) oxide, lanthanum (La) oxide, or the like.

Figure 3:
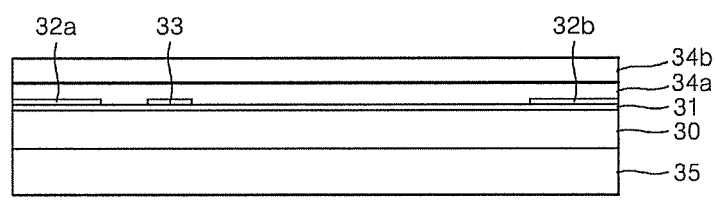
Figure 4:
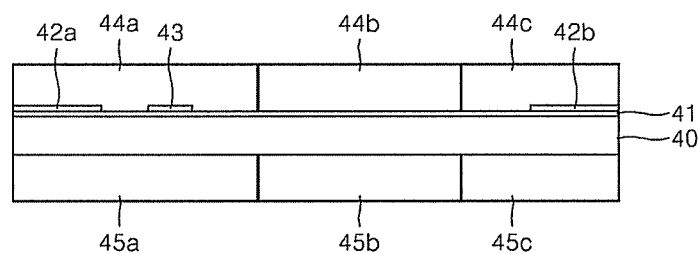

FIGS. 3 and 4 are cross-sectional views of power electronic devices each including an insulating layer having a low dielectric constant and formed on a bottom surface of a first semiconductor layer, according to example embodiments.

Referring to FIG. 3, a second semiconductor layer 31 is formed on a top surface of a first semiconductor layer 30. A source 32a, a drain 32b, and a gate 33 are formed on the second semiconductor layer 31 separate from one another. A first insulating layer 34a may be formed the source 32a, the drain 32b, and the gate 33 by using a high-k material, and a second insulating layer 34b may be formed on the first insulating layer 34a. In this regard, the second insulating layer 34b may be formed of a material having a lower dielectric constant than that of the first insulating layer 34a. An insulating layer 35 may be further formed on a bottom surface of the first semiconductor layer 30 by using a material having a relatively low dielectric constant.

Referring to FIG. 4, a second semiconductor layer 41 is formed on a top surface of a first semiconductor layer 40, and a source 42a, a drain 42b, and a gate 43 are formed on the second semiconductor layer 41 separate from one another. A first insulating layer 44a is formed on the gate 43 by using a material having a high dielectric constant, and a third insulating layer 44c may be formed on the drain 42b. A second insulating layer 44b is formed between the first insulating layer 44a and the third insulating layer 44c. In this regard, the second insulating layer 44b may be formed of a material having a lower dielectric constant than that of the first insulating layer 44a. A third insulating layer 44c may be fog wed of a material having a higher or lower dielectric constant than that of the second insulating layer 44b. In addition, a plurality of dielectric layers 45a, 45b, and 45c may be further formed on a bottom surface of the first semiconductor layer 40 by using materials having different dielectric constants.

FIGS. 5A through 5D are cross-sectional views of a method of manufacturing a power electronic device, according to an embodiment of the present invention. Here, a method of manufacturing the power electronic device illustrated in FIG. 1B is described. However, the method of manufacture may also be applied to manufacturing the power electronic devices of FIGS. 1A and 1C.

Figure 5A:
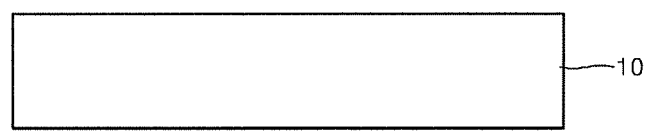
Figure 5B:
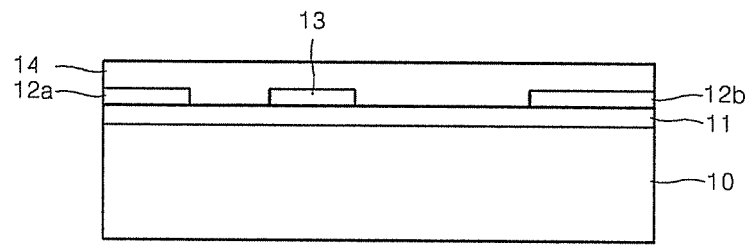

Referring to FIGS. 5A and 5B, a first semiconductor layer 10 is formed of a III-V group semiconductor compound, and a second semiconductor layer 11 is formed on the first semiconductor layer 10 to have a heterojunction structure with the material used to form the first semiconductor layer 10. A source 12a, a drain 12b, and a gate 13 are formed on the second semiconductor layer 11 by using a conductive material. A first insulating material 14 is deposited on the second semiconductor layer 11, the source 12a, the drain 12b, and the gate 13. In this regard, the first insulating material 14 may be a material having a high dielectric constant.

Figure 5C:
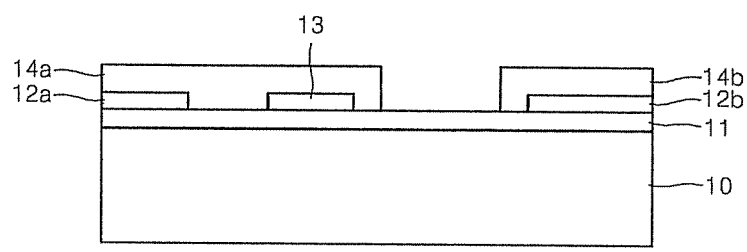

Referring to FIG. 5C, a first insulating layer 14a and a third insulating layer 14c are formed by removing part of the first insulating material 14 between the gate 13 and the drain 12b.

Figure 5D:
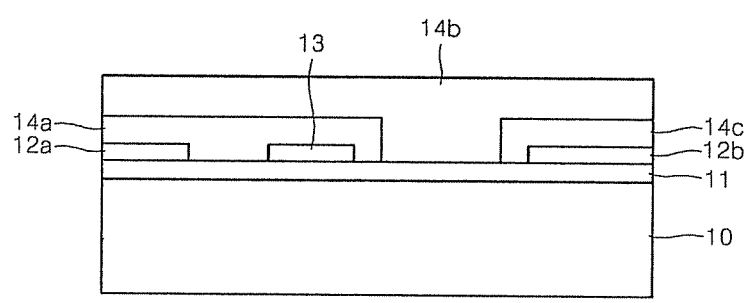

Referring to FIG. 5D, a second insulating layer 14b is deposited between the first insulating layer 14a and the third insulating layer 14c. The second insulating layer 14b may have a relatively low dielectric constant than that of the first insulating material 14. The second insulating layer 14b may be deposited on the first insulating layer 14a and the third insulating layer 14c so that the second insulating layer 14b may extend on the first insulating layer 14a and the third insulating layer 14c.

When a power electronic device is driven, a high-k material is formed in a gate region in which an electric field is concentrated, and a material with a relatively low dielectric constant is formed in regions other than the gate region so that a phenomenon that the electric field is concentrated only on a particular region may be prevented, an electric field dispersion effect of the power electronic device may be improved, and a breakdown voltage may be increased.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A power electronic device comprising:
   a first semiconductor layer;
   a second semiconductor layer on a first surface of the first semiconductor layer;
   a source, a drain, and a gate on the second semiconductor layer, the source, drain and gate being separate from one another;
   a 2-dimensional electron gas (2DEG) region at an interface between the first semiconductor layer and the second semiconductor layer;
   a first insulating layer on the gate, the first insulating layer having a first dielectric constant; and
   a second insulating layer at least adjacent to the first insulating layer, the second insulating layer having a second dielectric constant less than the first dielectric constant,
   wherein the gate is between the first insulating layer and the second semiconductor layer.

2. The power electronic device of claim 1, wherein the second insulating layer is around the first insulating layer.

3. The power electronic device of claim 1, wherein the first insulating layer is on the gate, the source, and the drain, and the second insulating layer is on the first insulating layer.

4. The power electronic device of claim 1, wherein the second insulating layer is on the drain.

5. The power electronic device of claim 1, further comprising:
   a third insulating layer having a third dielectric constant, wherein the second insulating layer is between the first insulating layer and the third insulating layer.

6. The power electronic device of claim 5, wherein the third insulating layer is on the drain.

7. The power electronic device of claim 5, wherein the first dielectric constant is equal to the third dielectric constant.

8. The power electronic device of claim 5, wherein the third dielectric constant is higher than the second dielectric constant.

9. The power electronic device of claim 1, wherein the first semiconductor layer comprises a III-V group semiconductor compound.

10. The power electronic device of claim 9, wherein the first semiconductor layer comprises at least one of gallium nitride (GaN), gallium arsenic (GaAs), indium nitride (InN) and a combination thereof.

11. The power electronic device of claim 1, wherein the second semiconductor layer comprises at least one of aluminum gallium nitride (AlGaN), aluminum gallium arsenic (AlGaAs), aluminum indium nitride (AlInN) and a combination thereof.

12. The power electronic device of claim 1, further comprising:
    a third insulating layer, wherein
    the third insulating layer has a third dielectric constant, and
    the first semiconductor layer is on the third insulating layer.

13. The power electronic device of claim 12, wherein the third dielectric constant is less than the first dielectric constant.

14. The power electronic device of claim 1, further comprising:
    a plurality of third insulating layers, wherein each of the third insulating layers has a different dielectric constant, and
    the first semiconductor layer is on the plurality of third insulating layers.

15. A method of manufacturing a power electronic device, the method comprising:
    sequentially stacking a first semiconductor layer and a second semiconductor layer;
    forming a source, a drain, and a gate on the second semiconductor layer;
    depositing a first insulating material on the source, the drain, and the gate;
    etching a portion of the first insulating material to form a recess; and
    depositing a second insulating material in the recess, the first insulating material having a first dielectric constant different from a second dielectric constant of the second insulating material.

16. The method of claim 15, wherein the first dielectric constant of the first insulating material is higher than the second dielectric constant of the second insulating material.

17. The power electronic device of claim 1, wherein the first insulating layer is an inorganic material.

18. The power electronic device of claim 1, wherein
    the first insulating layer includes one of silicon (Si) oxide, Si nitride, hafnium (Hf) oxide, aluminum (Al) oxide, calcium (Ca) oxide, copper (Cu) oxide, zircon (Zr) oxide, zinc (Zn) oxide, titanium (Ti) oxide, tantalum (Ta) oxide, barium (Ba) oxide, zinc silicon (ZrSi) oxide, and lanthanum (La) oxide;
    the second insulating layer includes one of silicon (Si) oxide, Si nitride, hafnium (Hf) oxide, aluminum (Al) oxide, calcium (Ca) oxide, copper (Cu) oxide, zirconium (Zr) oxide, zinc (Zn) oxide, titanium (Ti) oxide, tantalum (Ta) oxide, barium (Ba) oxide, zinc silicon (ZnSi) oxide, zirconium silicon (ZrSi) oxide, and lanthanum (La) oxide; and
    the first insulating layer and the second insulating layer contain different materials.

19. The power electronic device of claim 15, wherein the first insulating material is an inorganic material.

20. The power electronic device of claim 15, wherein
    the first insulating material includes one of silicon (Si) oxide, Si nitride, hafnium (Hf) oxide, aluminum (Al) oxide, calcium (Ca) oxide, copper (Cu) oxide, zircon (Zr) oxide, zinc (Zn) oxide, titanium (Ti) oxide, tantalum (Ta) oxide, barium (Ba) oxide, zinc silicon (ZrSi) oxide, and lanthanum (La) oxide;
    the second insulating material includes one of silicon (Si) oxide, Si nitride, hafnium (Hf) oxide, aluminum (Al) oxide, calcium (Ca) oxide, copper (Cu) oxide, zirconium (Zr) oxide, zinc (Zn) oxide, titanium (Ti) oxide, tantalum (Ta) oxide, barium (Ba) oxide, zinc silicon (ZnSi) oxide, zirconium silicon (ZrSi) oxide, and lanthanum (La) oxide; and the first insulating layer and the second insulating layer contain different materials.

21. The power electronic device of claim 1, wherein at least a portion of the first insulating layer is between the second insulating layer and the second semiconductor layer, and the second semiconductor layer is between the first semiconductor layer and the second insulating layer.

22. The power electronic device of claim 5, wherein the first insulating layer is on the source, the second insulating layer is on a portion of the second semiconductor layer exposed by the first insulating layer and the third insulating layer, the third insulating layer is on the drain, and the third dielectric constant is different than the second dielectric constant.

\* \* \* \* \*